US009736000B2

(12) United States Patent
Dabiri et al.

(10) Patent No.: US 9,736,000 B2
(45) Date of Patent: Aug. 15, 2017

(54) DUPLEX TRANSMISSION OVER REDUCED PAIRS OF TWINAX CABLES

(71) Applicant: APPLIED MICRO CIRCUITS CORPORATION, Sunnyvale, CA (US)

(72) Inventors: Dariush Dabiri, San Jose, CA (US); Tarun Gupta, Santa Clara, CA (US); Venkatesh Nagapudi, Milpitas, CA (US)

(73) Assignee: MACOM CONNECTIVITY SOLUTIONS, LLC, Lowell, MA (US)

( * ) Notice: Subject to any disclaimer, the term of this patent is extended or adjusted under 35 U.S.C. 154(b) by 151 days.

(21) Appl. No.: 14/179,727

(22) Filed: Feb. 13, 2014

(65) Prior Publication Data

US 2015/0326379 A1    Nov. 12, 2015

Related U.S. Application Data

(60) Provisional application No. 61/869,395, filed on Aug. 23, 2013.

(51) Int. Cl.
| | |
|---|---|
| *H03M 13/25* | (2006.01) |
| *H04L 27/34* | (2006.01) |
| *H04L 5/14* | (2006.01) |
| *H04B 1/38* | (2015.01) |
| *H04B 3/02* | (2006.01) |

(Continued)

(52) U.S. Cl.
CPC ...... *H04L 27/3483* (2013.01); *H03M 13/253* (2013.01); *H03M 13/3916* (2013.01); *H04B 1/38* (2013.01); *H04B 3/02* (2013.01); *H04L 1/0041* (2013.01); *H04L 1/0045* (2013.01); *H04L 1/0058* (2013.01); *H04L 1/0061* (2013.01); *H04L 1/0067* (2013.01); *H04L 5/14* (2013.01); *H04L 5/1423* (2013.01);

(Continued)

(58) Field of Classification Search
USPC ........................................................ 370/276
See application file for complete search history.

(56) References Cited

U.S. PATENT DOCUMENTS

| | | | |
|---|---|---|---|
| 5,483,020 A | 1/1996 | Hardie et al. | |
| 8,069,293 B1 * | 11/2011 | Rogan ................... | G06F 13/385 370/248 |

(Continued)

FOREIGN PATENT DOCUMENTS

WO    97/32252    9/1997

OTHER PUBLICATIONS

International Search Report & Written Opinion for PCT Application Serial No. PCT/US2015/042589, mailed Apr. 27, 2016, 13 pages.

*Primary Examiner* — Mohammad Anwar
*Assistant Examiner* — Kokou R Detse
(74) *Attorney, Agent, or Firm* — Amin, Turocy & Watson LLP

(57) ABSTRACT

Cable systems and assemblies integrate a reduced number of twin axial copper pairs to transmit and received in a full-duplex transmission signals at transmission speeds greater than or equal to one hundred Giga bytes per second. The reduced number of twin axial copper pairs comprise four or less twin axial copper pairs, in which each pair forms a single twin axial full-duplex cable for passive or active communication of the signals. A processor can be integrated with the twin axial copper pairs operate to encode the signals for fast transmission speeds.

20 Claims, 10 Drawing Sheets

(51) Int. Cl.
*H04L 27/00* (2006.01)
*H04L 1/00* (2006.01)
*H03M 13/39* (2006.01)
*H04L 7/04* (2006.01)
*H03M 13/13* (2006.01)

(52) U.S. Cl.
CPC .......... *H04L 7/042* (2013.01); *H04L 27/0002* (2013.01); *H03M 13/134* (2013.01)

(56) References Cited

U.S. PATENT DOCUMENTS

| | | |
|---|---|---|
| 8,989,283 B1 | 3/2015 | Dabiri |
| 2007/0103204 A1* | 5/2007 | Egan et al. ............ G09G 5/006 327/100 |
| 2008/0044141 A1* | 2/2008 | Willis et al. ......... G02B 6/3887 385/88 |
| 2010/0307790 A1 | 12/2010 | Okano |
| 2012/0263454 A1 | 10/2012 | Koike-Akino et al. |
| 2013/0117639 A1* | 5/2013 | Ganga ................... H03M 5/145 714/776 |
| 2013/0208771 A1* | 8/2013 | Wang ..................... H04L 25/02 375/219 |

* cited by examiner

DUPLEX TRANSMISSION OVER REDUCED PAIRS OF TWINAX CABLES

CROSS-REFERENCE TO RELATED APPLICATION(S)

The subject application for patent claims priority to U.S. Provisional Patent Application No. 61/869,395 entitled "TRANSMISSION OVER REDUCED PAIRS OF TWINAX CABLES AND COMMUNICATION CODING" filed Aug. 23, 2013, which is incorporated by reference herein in its entirety and for all purposes.

TECHNICAL FIELD

The subject disclosure relates generally to full duplex transmissions and more particularly to transmissions over reduced pairs of twin axial cables.

BACKGROUND

Cables are often utilized as physical media to connect devices that may be networked. Signals can be sent over a physical layer of wires, for example, in which signal coding can be used for enhancing the transmission. The cable can include a data link layer for messages sent between a controller (master) and a slave device. The messages could have a set of normal bits for bit synchronization, followed by a frame sync pattern, for example. The frame sync pattern, for example, can be followed by data bit frames, in which each frame could include a start bit, a bit data field, a parity bit and/or a set of fill bits of zero.

For applications requiring a high data rate with low latency performance, such as in Storage Area Networks and High Performance Computing, the interconnect media selected should have a very high bandwidth capacity, such as with twin axial (twinax) cable, to support the un-modulated baseband signal. To obtain low latency while having low power dissipation, baseband digital communication is typically used instead of a complex modulation scheme requiring sophisticated coding techniques. A drawback is media analog bandwidth. For example, in order to support 10 Gbps (Gigabit/sec) data communication, the media support a certain frequency Hertz of analog bandwidth. In order to achieve these bandwidths, the cable design and coding is refined to address performance parameters in this frequency range.

The above-described description is merely intended to provide a contextual overview of current cable interconnects and is not intended to be exhaustive. Other problems with conventional systems and corresponding benefits of the various non-limiting embodiments described herein may become further apparent upon review of the following description.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

Various embodiments for twin axial transmission over a reduced number of twinax pairs integrated together at respective ends are disclosed herein. An exemplary system comprises a set of duplex twinax pairs configured for communicating a set of signals in different directions. A plug assembly is configured for integrating at least one end of the set of duplex twinax pairs with a set of interconnects, and connecting the at least one end with an interface port. The plug assembly comprises a transceiver component configured for communicating the set of signals in the different directions to and from the interface port via the set of duplex twinax pairs, and a processor that is operatively coupled to the transceiver component. The processor is configured for digital signal processing of the set of signals for transmission via the set of duplex twinax pairs.

In another embodiment, a method comprises integrating a reduced set of twinax pairs with a processor and a transceiver of a plug assembly. One or more signals can be received via the plug assembly. At least a part of the one or more signals is encoded with a first communication protocol by the processor. The transceiver transmits the one or more signals via the reduced set of twinax pairs from the processor.

In yet another embodiment, a device comprises a memory to store computer-executable instructions, and a first processor, coupled to the memory, that facilitates execution of the computer-executable instructions to perform operations. The operations comprise transmitting a first set of signals via a twin axial copper cable assembly comprising four or less twinax copper pairs to a second device in a first communication protocol at a transmission speed greater than one hundred Gigabytes per second. A second set of signals is received simultaneously in a full-duplex transmission mode from the second device via the four or less copper twinax pairs of the twin axial copper cable assembly.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
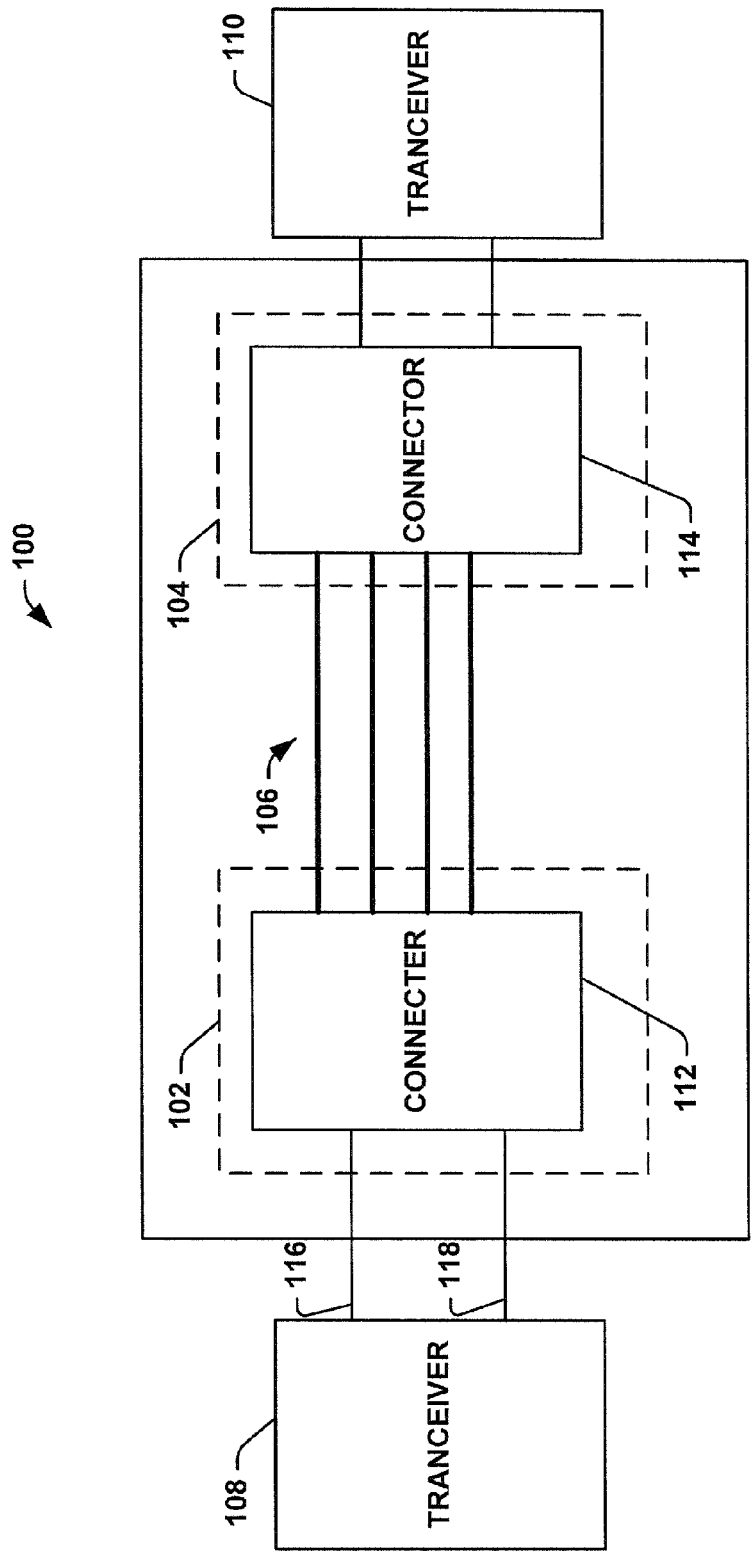
FIG. 1 is a block diagram illustrating an example, non-limiting embodiment of a cable assembly system in accordance with various aspects described herein.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

In consideration of the above-described trends or deficiencies among other things, various embodiments are provided for 100 Gbps transmission rates or greater for full-duplex communications over a reduced number of twinaxial (twinax) pairs. For example, a cable assembly can include a set of twinaxial (or "twinax") cables that can each comprise a full-duplex twinax pair of conductors or a half-duplex twinax pair of conductors. The cable assembly can be configured for communicating one or more signals in two directions simultaneously at transmission speeds of 100 Gigabytes per second or greater, such as processing or transmitting communications at speeds greater than 150 Gigabytes per second or greater than 200 Gigabytes per second. One twin axial cable can comprise, for example, a twin axial conductor pair, or, in other words, two inner conductors. The cable assembly can comprise, for example, four twin axial cables that comprise four twinax pairs of full-duplex twin axial conductors so that each twin axial cable comprises a twin axial pair (pair of conductors) integrated together to form one cable assembly that can communicate between workstations or devices in high speed, full-duplex communications of data signals for further networking of components or processing.

The twin axial cables can communicate signals according to a full-duplex data transmission, for example, which means that data can be transmitted in both directions on a signal carrier at the same time or simultaneously, or in a half-duplex mode where one direction is communicated at a time For example, on a local area network with a technology that has full-duplex transmission, one workstation (e.g., device) can be sending data via the cable assembly over at least one conductor of the twinax pair of a twinax cable, while another workstation is receiving data across the same or different twinax pair, or, in other words, over the set of twinax pairs integrated within the cable assembly, in which a "set" as used herein can mean "one or more." Full-duplex transmission implies a bidirectional communication path or line (one that can move data in both directions). Each twinax pair can comprise or constitute a full-duplex twinaxial (twinax) cable. For example, the twinaxial cables can comprise a two-conductor twisted balanced wire, which can have the same or different impedances and a shielding braid that can be wrapped around the two wires or the two conductors. Unlike a simple coaxial cable, twinax wire pairs can include two inner conductors instead of one.

In one embodiment, the cable assembly can be configured as a passive cable device or as an active cable device, in which either can operate at speeds of at least one hundred Gigabytes per second (100 Gbps) with a reduced number of twinax cable pairs within the cable assembly, such as four or less twinax cable pairs being integrated into the one cable assembly. Processing of communication can also be performed at speeds greater than 150 Gbps and greater than 200 Gbps. The cable assembly can be configured as a passive interconnect cable assembly that does not draw power from within the cable assembly, or as an active assembly that draws power from one or more ends of the twinax pairs into the cable assembly. The passive interconnect cable assembly operates to not consume power and the active cable assembly draws or consumes power at the ends of the cable assembly. The twinax cable pairs can comprise a pair of copper cables, wires or conductors that deliver a high performance option to the interconnections between devices at short and long range distances with increased speed. Although copper conductor, wires, and the like are discussed within various embodiments, cables or twinax pairs with metal conductors other than copper are also envisioned (e.g., alloys such as but not limited to gold, silver, platinum or the like).

Turning initially to FIG. 1, illustrated is one embodiment of a cable assembly 100 that is configured as a passive cable device for communicating signals in a full-duplex transmission mode at 100 Gbps via four pairs of conductors or less, eight conductors total or less, four pairs of twinax pairs or less, or, in other words, four twinax cables or less. The cable assembly 100 comprises a plug assembly 102 and a plug assembly 104 that can respectively operate as an end housing that integrates and combines interconnects and components for facilitating full-duplex communications between devices or device components along a reduced set of full-duplex twinax wire pairs 106.

The plug assemblies 102 and 104 can be located at each end of the cable assembly 100 and configured for integrating the respective ends of the set of full-duplex twinax wire pairs 106 with one or more receiving ports or plugs (not shown) of user devices (not shown) for signal communication via the twinax pairs 106. Each twinax pair can comprise a pair of conductors or a single twinax cable within the cable assembly 100.

The plug assemblies 102 and 104 can respectively comprise a transceiver 108 and a transceiver 110 for receiving and transmitting signals, which can be integrated with a processor as a transceiver microprocessor or controller respectively. The transceivers 108 and 110 can also be located on a circuit board of a user device and operatively coupled to connectors 112 and 114 at each of the twinax cable ends so that the transceivers 108 and 110 are external to the plug assemblies 108 and 110. The transceivers 108 and 110 can comprise traces on a circuit board (not shown), for example, or other conductor interfaces or paths that provide interconnections (e.g., copper interconnects) to the twinax pairs 106 and the transceivers 108 and 110 via the plug assemblies 102 and 104.

In one example, the transceiver 108 and 110 can be located on a reception or receiving port, jack or sleeve on a respective user device, such as a processor device and other component device connected via the cable assembly 100. The transceivers 108 and 110, for example, can support various communication protocols such as Ethernet, Sonet/SDH, Fibre Channel applications across various switching and routing architectures for implementation in Local Area Network (LAN), Wide Area Network (WAN), Metropolitan Area Network (MAN), ring networks, storage area networks and the like, as well as for communications between devices that can be connected within these networks for various transmission media. Alternatively or additionally, the transceivers 108 or 110 can operate as a receiver that receives and processes communication transmissions or as a transmitter that transmits and processes communication data for transmission only. The transceiver 108, 110 can further include multiple transceivers for receiving or transmitting communications.

In one embodiment, the transceivers 108 and 110 comprise one transceiver at each end of the cable assembly 100 and that is operatively coupled to the connector 112 and the connector 114 respectively. For example, a receive and a transmit line from the transceiver 108 to the connector 112 enables communication signals to be transmitted and received to the connector 112 and via the twinax cables 106 that each comprise a twinax cable pair of conductors. The receive path 116 and transmit path 118 illustrated can be routed traces, or other interconnects (e.g., copper interconnects), which can operate to receive and/or transmit over the same interconnect.

The twinax cables 106 operate to transmit and receive data that can be encoded, partitioned or reformatted for transmission via the connectors 112, 114 at 100 Gbps (Gbps) or at greater transmission rates, for example. The connectors 112 and 114 can be different from one another or the same, for example, and further comprise interfaces that can function to automatically terminate the twinaxial cables or twinaxial pairs, integrate the transmissions between different impedances, or convert between signals that can be balanced or unbalanced. The connectors 112 and 114 can, for example, comprise interfaces that enable signals received or transmitted to comply with a multitude of standards and integrate the twinax pairs to share a common connector for joining to an electronic device. In one example, multiple different standards could be transmitted over the same cable and/or different twinax pairs with various pin connections or trace connections within each connector 112 or 114. Each connector, for example, can comprise a clock (not shown) for re-timing or re-clocking different signals also. The connectors 112 and 114 can comprise balun connectors for the twinax pairs and/or other interfaces, for example, such as a Medium Dependent Interface (MDI), PMDA, SERDES, etc.

Figure 2:
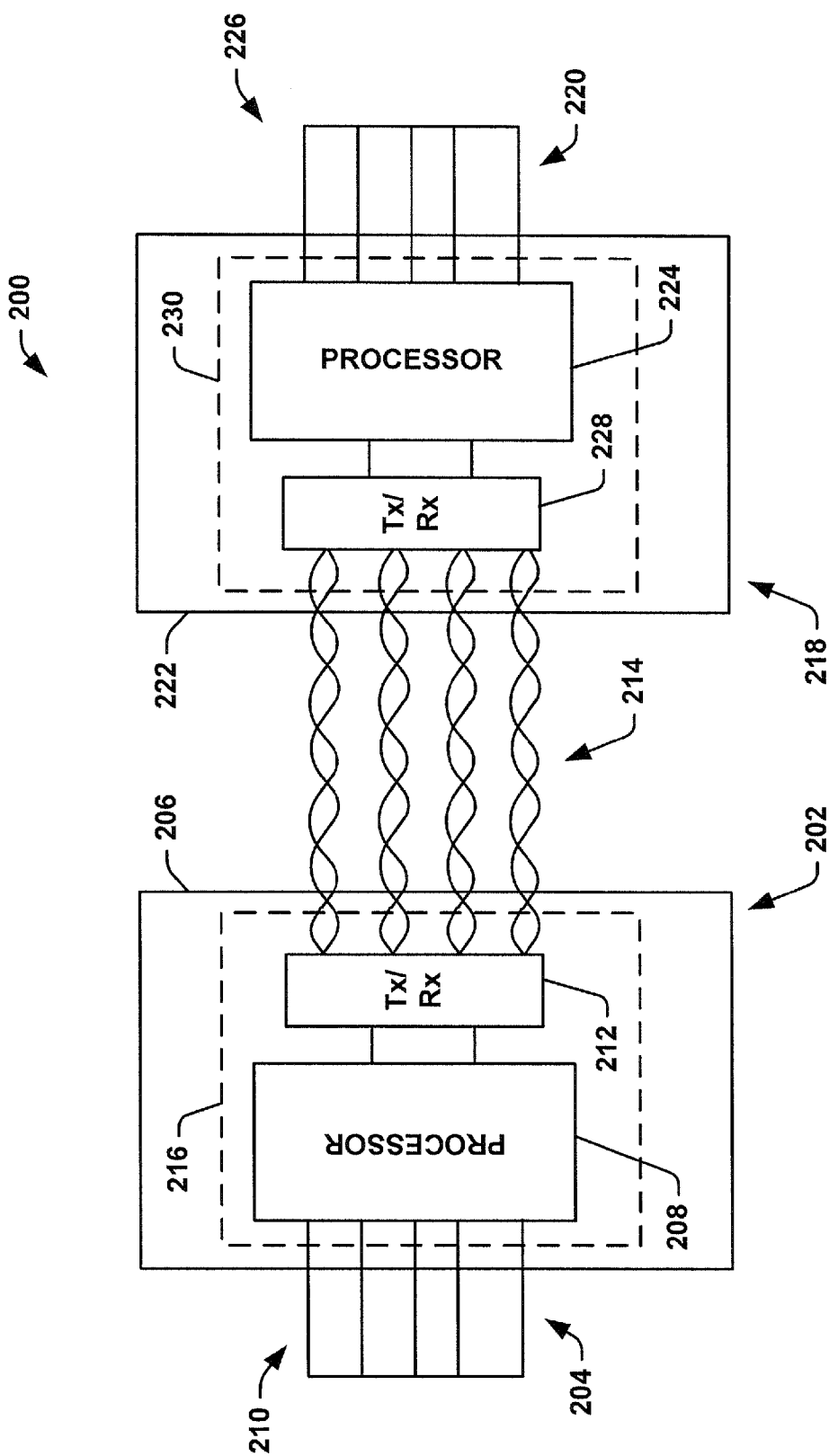
FIG. 2 is a block diagram illustrating another example, non-limiting embodiment of a cable assembly system in accordance with various aspects described herein.

Referring now to FIG. 2, illustrated is an embodiment of a cable assembly 200 that comprises a first end section 206 and a second end section 222 for an interconnection of one or more devices (not shown), such as a computer device, mobile processing device, display device personal digital assistant, etc. The cable assembly 200 is operable as an active twinax cable device for high speed, full-duplex transmissions among devices or device processors with a reduced set of twinax conductor pairs. Additionally, the cable assembly 200 can operate to simultaneously transmit and receive data at a transmission speed of 100 Gbps or greater for one or more different communication protocols. Additionally or alternatively, the cable assembly 200 with four or less twinax pairs can operate to simultaneously transmit and receive data at a transmission speed of 800 Gbps or greater for one or more different communication protocols.

For example, the cable assembly 200 comprises an interface 210 and an interface 226 at each end that can include a set of interconnects 204, 220 (e.g., copper interconnects or paths) that interface with a receiving port or a plug such as a Quad Small Form-factor Pluggable (QSFP), a Small Form-factor Pluggable, or other pluggable connector. The interface 210 and 226 can be operatively connected to a circuit board 216 and 230 or a surface mount or processor package mount (e.g., a ball grid array or the like) having a processor 208 and 224. The interface 210 and 226 includes a plug portion of the cable assembly 200, which operates as a mate for connection to a plug or port of a device or processing device for communication between one or more other devices. The cable assembly 200 operates as an active cable device that draws or consumes power at one or more ends of the assembly 200, and further processes, encodes and decodes transmissions of one or more communication protocols with low bit error rates and high efficiency.

The cable assembly 200 comprises a plug assembly 202 and 218 at an end of the cable assembly 200 that comprises the plug portion or the interface 210 that operates as the mate for connection to a plug or port of a device. The plug assembly 202 or 218 can comprise a processor 208 or 224 operatively connected to the circuit board 216 or 230 or a surface mount respectively. The processor 208 or 224 can operate with a transceiver 212, 228 to encode, decode, partition, or process error correction code (ECC) such as Forward Error Correction Code (FEC) according to one or more algorithms that can enable high speed, full-duplex transmissions of data at 100 Gbps or greater Gbps via the twinax pairs 214.

In one embodiment, the processors 208 or 224 can operate to draw or consume power from an independent power source (not shown) located internally, which can be coupled to the circuit board or processor package 216, 230. In addition or alternatively, the signals being transmitted can be used to power the cable. For example, a power signal transmission can be utilized to power the processors for transmission, such as by an electromagnetic coupling or other remote power signals. A power source from the device coupled to the cable assembly can also be utilized to power the processors 208, 224, such as from an external power source located on the device.

The processors 208 and 224 can be integrated as transceiver processors that operate to transmit and receive signals for full-duplex transmissions along the twinax pairs. In addition or alternatively, the processors 208 and 224 can be coupled to a transmitter, receiver, or transceiver 212, 228 located within the plug assembly 202, 218. For example, a transceiver 212, or 228 can be coupled to the processors on the circuit board 216 or 230 via routed traces or a processor package having connect pads, ball grid array, or other like interconnects mounted on the circuit board 216, 230 (e.g., a printed circuit board) of the cable assembly 200.

The cable assembly 200 can be similar to the cable assembly 100 discussed above, but instead of having a microprocessor on a device board and a connector to the plurality of twin axial cables 214, a microprocessor 208, 224 can be integrated on the head of the twinax cables 214, in which the connection on the head of the microprocessor through the circuit board is the plug or interface 210 or 226 and/or a receiving port, for example. Therefore, the cable side of operation can operate to drive the cable assembly 200 with power drawn or consumed with an integrated mount and package on a substrate (e.g., a semiconductor substrate).

In another embodiment, the cable assembly 200 can include one side having service connections via the board that are coupled to the interconnects 204, 220. One transceiver end (e.g., the plug assembly 202) can be coupled to the twinax pairs or twinax cables 214 (e.g., four twinax copper pairs or eight conductors) in which each pair is bi-directional or a full-duplex communication system to receive one communication protocol while another end converts the communication protocol to another communication protocol in order to standardize a diversity of different communication signals into one signal for use by multiple different ports or jacks within devices. At the other end of the cable assembly 200 (e.g., the plug assembly 218) can operate to decode and also convert back to the first communication protocol based on the type of connecting device or connecting interface 210, 226. The plug assembly 202 or 218 can operate to comply with multiple different standards for communication. One end of the cable assembly could process one communication protocol and the other end a different communication protocol, or both ends the same communication protocol depending upon the mode of operation selected by the processor, the device in which the plug assemblies are interfaced with or connected to, a specification provided by the device connected to the cable assembly 200, and/or a selection of one or more of the twinax pair of twinax pairs for communication. For example, the plug assembly 202 or 218 can operate in a first mode for a first communication protocol or in a second mode for a different communication protocol of communication, in which one or more of communication data or signals in the communication protocols can be transmitted over eight or less conductors of four or less pairs of twinax cables at 100 Gbps or a greater transmission rate.

Figure 3:
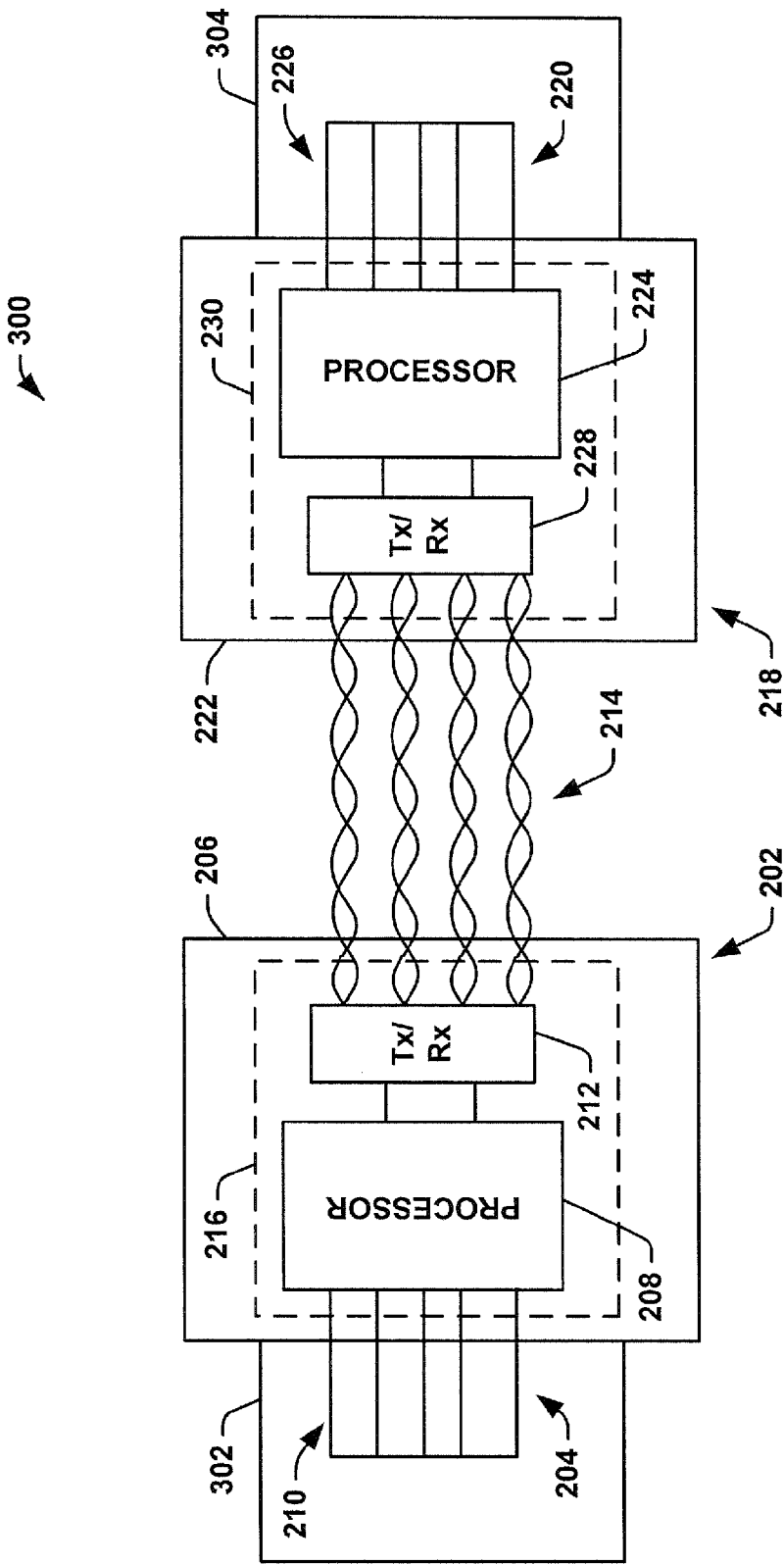
FIG. 3 is a block diagram illustrating another example, non-limiting embodiment of cable assembly system in accordance with various aspects described herein.

Referring now to FIG. 3, illustrated is an example embodiment of the cable assembly 300 coupled to a plug 302 and a plug 304, which can comprise a receiving port, for example, which can be a Quad Small Form-factor Pluggable (QSFP), a Small Form-Factor Pluggable (SFP) port, a Small Form Factor SFF casing, or the like receiving port. The cable assembly 300 is similar to the cables assemblies discussed above with similar components for operation.

The cable assembly 300 includes interfaces 204 and 220 operate with the surface mount components to join the interconnects 204, 220 therein with the plug 302 and 304 respectively as a cage and a mate. The plug 302 and 304 can comprise QSFP and/or SFP protocols, which are form factors designed to reduce costs and power consumption, improve reliability and reduce thermal footprint: SFP plus is a small form factor pluggable plus (specified under SFF-8431) and QSFP is quad small form factor pluggable (specified under SFF-8436). Originally intended for an optical form factor, these interfaces can include copper interconnect solutions. The SFP and QSFP form factors are lower power-consuming modules, in which lower power (less heat) increases reliability.

The board 216 comprises the chip or processor 208 mounted at the head of the cable assembly 202, in which the chip or processor 208 is powered through the QSFP connection of the plug and the plug assembly 210. The chip can operate as a transceiver chip that is connected to the plurality of twinax cables 214. In one embodiment, the plurality of twinax pairs 214 can comprise different cable assembly configurations that communicate at different transmission rates in a single cable assembly 200 with multi-rate communication transmissions. The plurality of twinax pairs 214 can comprise a first twinax pair, a second twinax pair, a third twinax pair, and a fourth twinax pair, in which each twinax pair can comprise a pair of conductors that can respectively communicate at various transmission rates (e.g., 100 Gbps, 40 Gbps and/or 10 Gbps).

Figure 4:
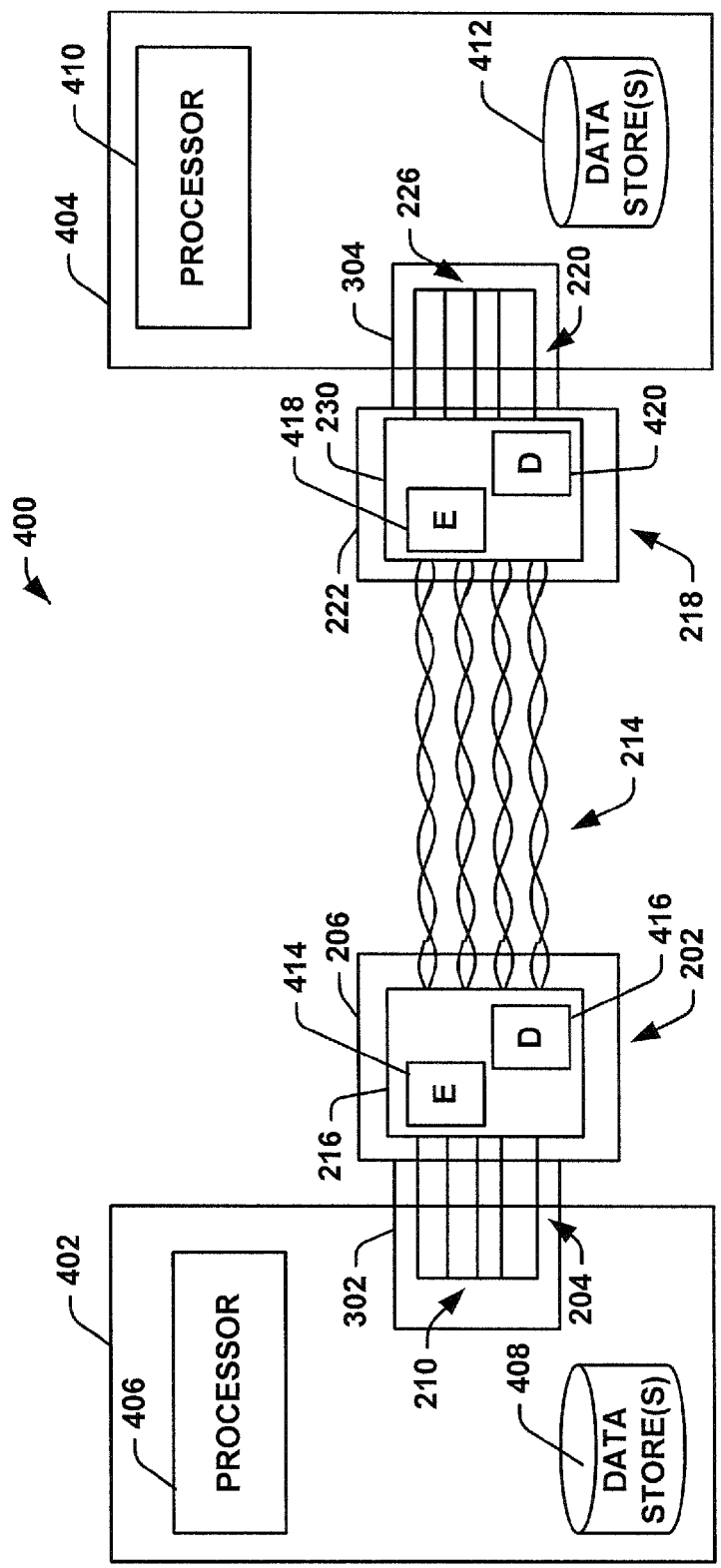
FIG. 4 is a block diagram illustrating another example, non-limiting embodiment of cable assembly system in accordance with various aspects described herein.

Referring now to FIG. 4, illustrated is an example of a cable assembly that operates at high speed transmission for transmitting and receiving data back and forth from one or more devices. A cable assembly 400 comprises similar components as discussed above and further includes encoding components and decoding components mounted on a surface mount or circuit board within the plug assemblies 202 and 218

The cable assembly 400 is operatively coupled to a first device 402 and a second device 404 via the reduced set of twinax pairs 214 at speeds of 100 Gbps or greater. The first device 402 or the second device 404 can respectively comprise a processor 406, 410 and one or more data stores 408 and 412. The first device 402 or the second device 404 can comprise a processing device such as a personal computer device, a mobile device, an input/output device, a display, a personal digital assistant, or other similar device operable for communicating via the plug 302 or 304.

The surface mount or electronic board 216, 230 of the plug assemblies 202 and 218 at opposite ends of the twinax pairs 214 can comprise encoders 414 and 418 and decoders 416 and 420 respectively that are operatively coupled to a processor and/or transceiver architectures on the circuit boards 216, 230 or a mounting assemblies. The encoder 414, for example, can operate to convert at least a part of information of signals from one format, code or communication protocol to another via one or more algorithms based on a selection of a communication protocol. For example, the selection can be predetermined or dynamic based on the type of devices coupled to the cable assembly 400. The communication protocol (e.g., a Universal Serial Bus standard, a Peripheral Component Interconnect Express standard, a Display Port standard, High-Definition Multimedia Interface, S-Video, RCA, etc.), for example, can be based on a specification or a determination by the device of the one or more signals, a communication protocol of the one or more signals, a device communication protocol of the first device or the second device coupled to one or more ends of the reduced set of twinax pairs 214, and/or a selection of a twinax pair of the reduced set of twinax pairs, which can be specified by a processor (e.g., 208, 224 discussed supra) of the cable assembly 400.

The decoder 416 or 420 can operate to reverse the operation of the encoder in order to convert the information from one format or protocol into the original format or protocol. For example, the decoder 416 or 420 can operate to convert binary information from a number of lines to a unique output lines. For example, in cases where one or more encoders encode data from the first device 402 into one format for high speed transmission, the plug assembly 218 can operate to decode and/or re-code the data based on the second device 404 being a different device operating in a different communication protocol.

In one embodiment, the twinax pairs 214 comprise only four or less pairs of conductors for communicating over twinax cables at a transmission rate of 100 Gbps or greater. In one example, the cable assembly 400 comprises the plurality of twinax cables 214 that operate at multi-rate transmission speeds. The plurality of twinax pairs can comprise a first twinax pair and a second twinax pair that operate at multi-rate transmissions or at different transmission rates respectively. For example, the first twinax pair can operate within the cable assembly at a forty Gigabytes per second rate and the second twinax pair can operate at a ten Gigabytes per second rate. The cable assembly can operate as an active assembly that draws or consumes power similar to that discussed above.

The plurality of twinax pairs comprising the first twinax pair and the second twinax pair, for example, can comprise an active copper, in which rather than four pairs both of the twinax pairs (first and second) can be two twinax cables that are operable as full-duplex transmission lines that are two directional with 40 Gbps and 10 Gbps transmission speeds. The cable assembly therefore has twinax pairs that can have two pairs of conductors operating at 40 Gbps, and two 10 Gbps, and/or one 100 Gbps cable assembly.

Figure 5:
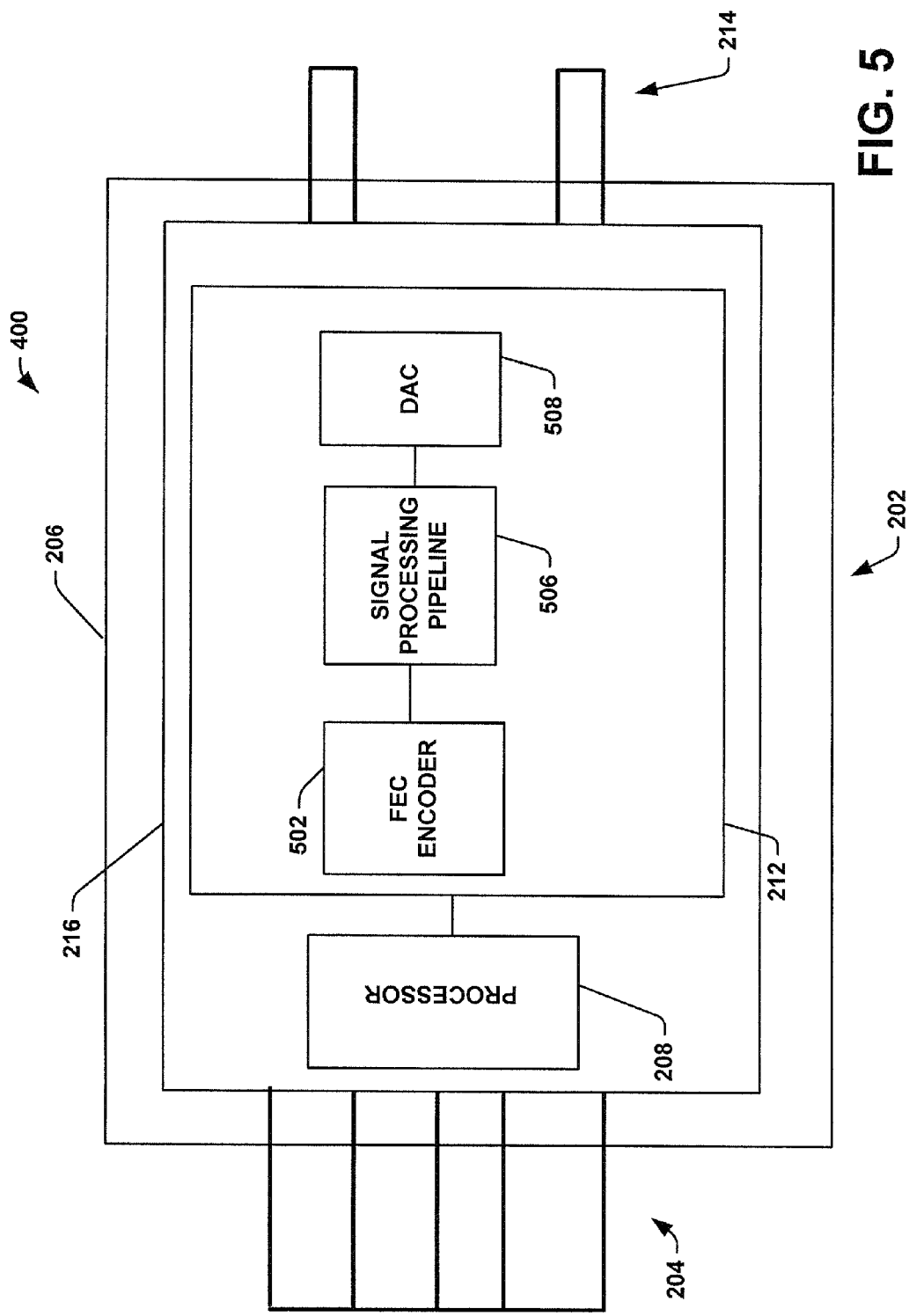
FIG. 5 is a block diagram illustrating an example, non-limiting embodiment of a transceiver system in accordance with various aspects described herein.
Figure 6:
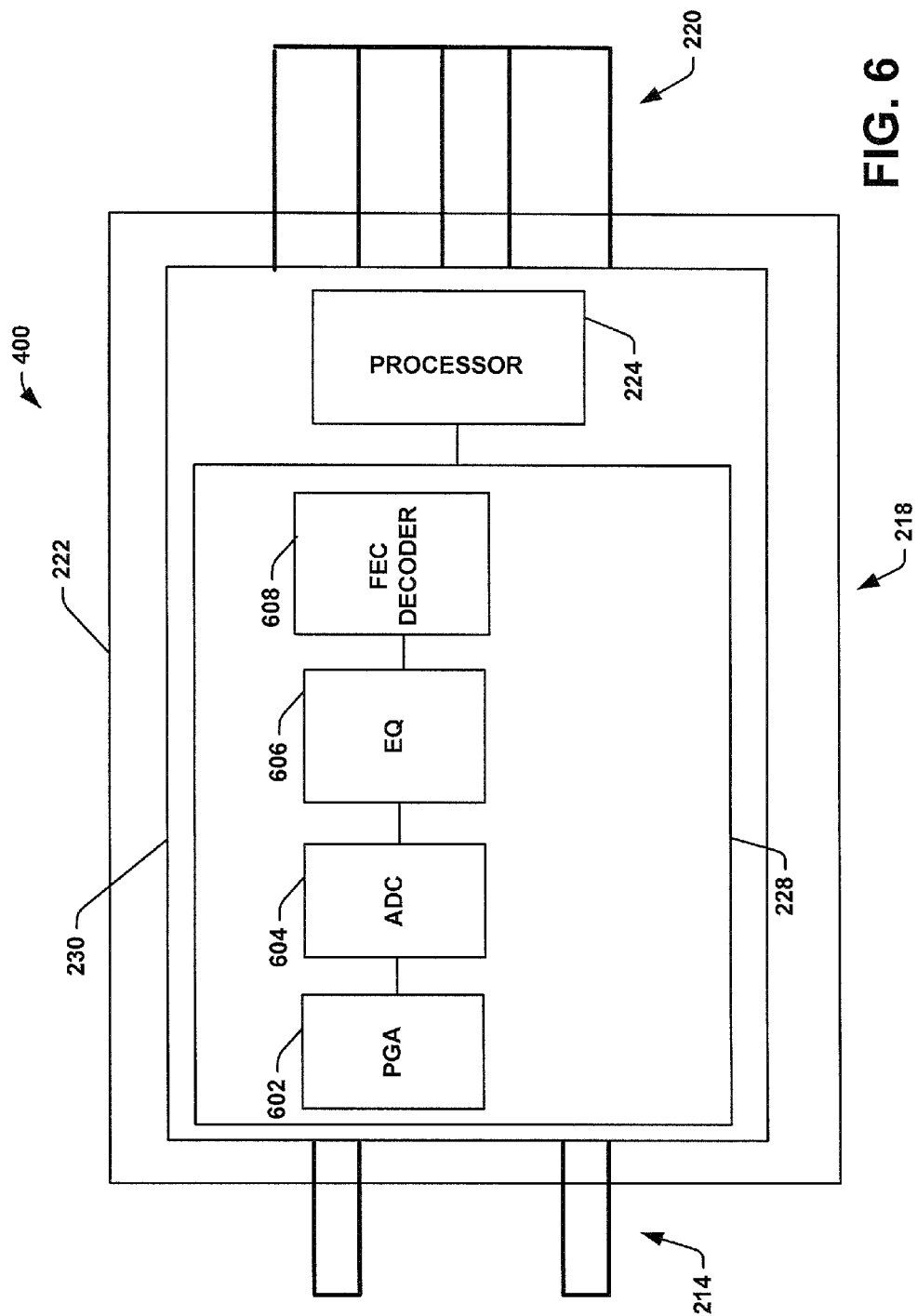
FIG. 6 is a block diagram illustrating another example, non-limiting embodiment of a transceiver system in accordance with various aspects described herein.

Referring now to FIG. 5 and FIG. 6 together, illustrated are further aspects of transceiver architectures for the cable assembly 400 discussed in this disclosure. FIG. 5, for example, illustrates the plug assembly 202 having a transceiver architecture for transmission of encoded data at high transmission speeds (e.g., 80 Gbps or 100 Gbps, and greater). FIG. 6, for example, illustrates the plug assembly 202 having a transceiver architecture for receiving of encoded data at high transmission speeds (e.g., 80 Gbps or 100 Gbps, and greater). These illustrations are examples for the sake of explanation and the architectures discussed can be comprised by both plug assemblies 202 and 218, or comprised in opposite plug assemblies 218 and 202 for a communication encoding and decoding in the opposite direction.

FIG. 5 illustrates similar components as discussed above with the transceiver component 212 comprising a Forward Error Correction (FEC) encoder 502, a signal processing pipeline 506 and a Digital-to-Analog Converter (DAC) 508. The FEC encoder 502 operates to encoded data received and to transmit most significant bits (msbs) to a signal processing pipeline 506, which can include one or more processing components for processing signals concurrently. The signal processing pipeline 506, for example, can include a mapper that receives signals over a set of bit stream pathways (e.g., three connections) and assimilates the data to output a set of symbols for transmission across the channel (e.g., the twinax pairs 214). The DAC 508 converts the digital signal to an analog signal for transmission.

FIG. 6 illustrates similar components discussed above also with the transceiver component 228 comprising a programmable gain amplifier (PGA) 602, an Analog-to-Digital Converter (ADC) 604, an equalizer component 606, and an FEC Decoder 608. The twinax pairs 214 communicate (transmit and receive) in a full-duplex mode of transmission to and from the transceiver component 228. The signal can be amplified by the PGA 602, converted from analog to digital by the ADC 604, equalized by the equalizer 606 and further decoded by the FEC decoder 608 for 80 Gbps or 100 Bbps and greater transmissions.

Example Methods of Full Duplex Transmission Over Reduced Pairs of Twinax Cables

While the methods or process flows described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 7:
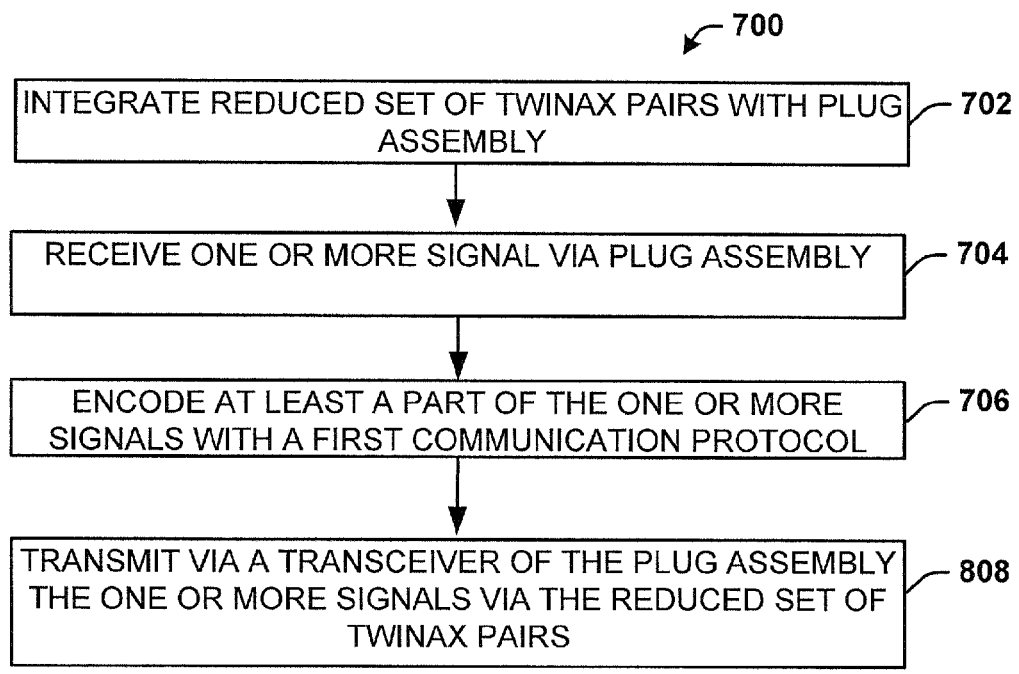
FIG. 7 illustrates a flow diagram of a non-limiting embodiment for a cable assembly system in accordance with various aspects described herein.

An example method 700 for a cable assembly to transmit and receive communication data at high speed transmissions along a reduced set of twinax pairs is illustrated in FIG. 7. At 702, the method 700 comprises integrating a reduced set of twinax pairs with a processor and a transceiver of a plug assembly. The twinax pairs are reduced to four or less pairs of twin axial conductors, such as twin axial copper conductors that enable full-duplex communication between different end devices via the twinax pairs. The cable assembly is operable at 80 Gbps or greater, such as at 100 Gbps transmission rates for transmission of signals in full duplex communication modes.

At 704, the method comprises receiving one or more signals via the plug assembly.

At 706, at least a part of the one or more signals is encoded with a first communication protocol by the processor. The encoding can further comprise encoding at least a portion of the one or more signals in a second communication protocol to transmit the one or more signals from the first device and to the second device. The method 700 can also include selecting from the first communication protocol and the second communication protocol which protocol to encode the at least the part of the one or more signals. For example, the selecting can be based on at least one of a specification of the one or more signals, a communication protocol of the one or more signals, a device communication protocol of the first device or the second device coupled to one or more ends of the reduced set of twinax pairs, or a selection of a twinax pair of the reduced set of twinax pairs.

At 708, the transceiver transmits the one or more signals via the reduced set of twinax pairs from the processor via the reduced set of twinax pairs.

In one embodiment, integrating the reduced set of twinax pairs with the processor and the transceiver of the plug assembly can comprise integrating four or less twin axial cables that respectively comprise a pair of twinax conductors with a microprocessor package assembly having a mounting assembly to a circuit board. Receiving and transmitting the one or more signals can comprise communicating the one or more signals in a full-duplex communication simultaneously in different directions between a first device and a second device.

Figure 8:
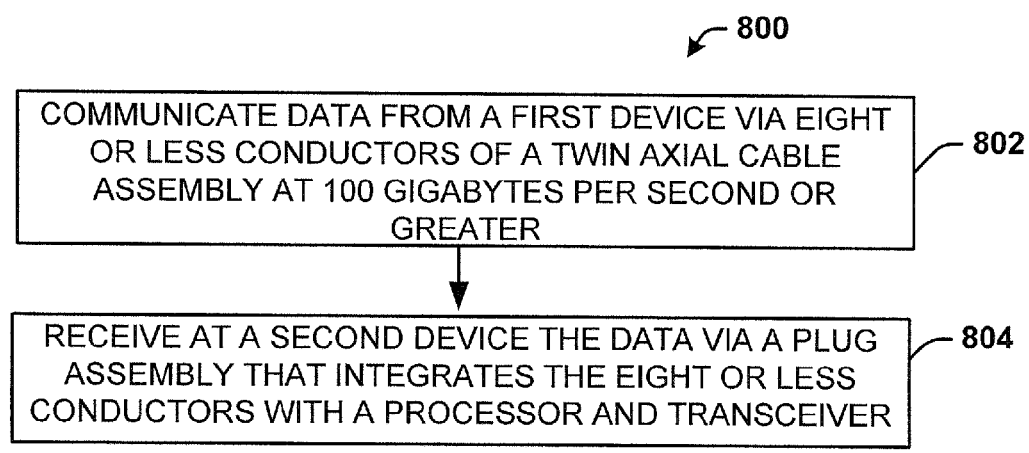
FIG. 8 illustrates a flow diagram of another non-limiting embodiment for a cable assembly system in accordance with various aspects described herein.

Referring now to FIG. 8, illustrated is a method 800 for a cable assembly operable to communicate data at 100 Gbps or greater over reduced pairs of twinax pairs. For example, four or less cables each having a twinax pair or pair of twin axial conductors, such as copper conductors or conductors of another alloy can operate to transmit and receive signals in a full-duplex communication mode at increased rates of 100 Gigabytes per second or greater.

At 802, data is communicated from a first device via eight or less conductors (e.g., copper conductors) that form four or less twinax pairs for a full duplex communication mode in a twin axial cable assembly at 100 Gigabytes per second or less.

At 804, the data is received at a second device via a plug assembly that integrates the eight or less conductors forming four or less twinax pairs in the full duplex communication mode via the plug assembly that integrate the eight or less conductors with a processor and a transceiver.

Example Computing Environment

Figure 9:
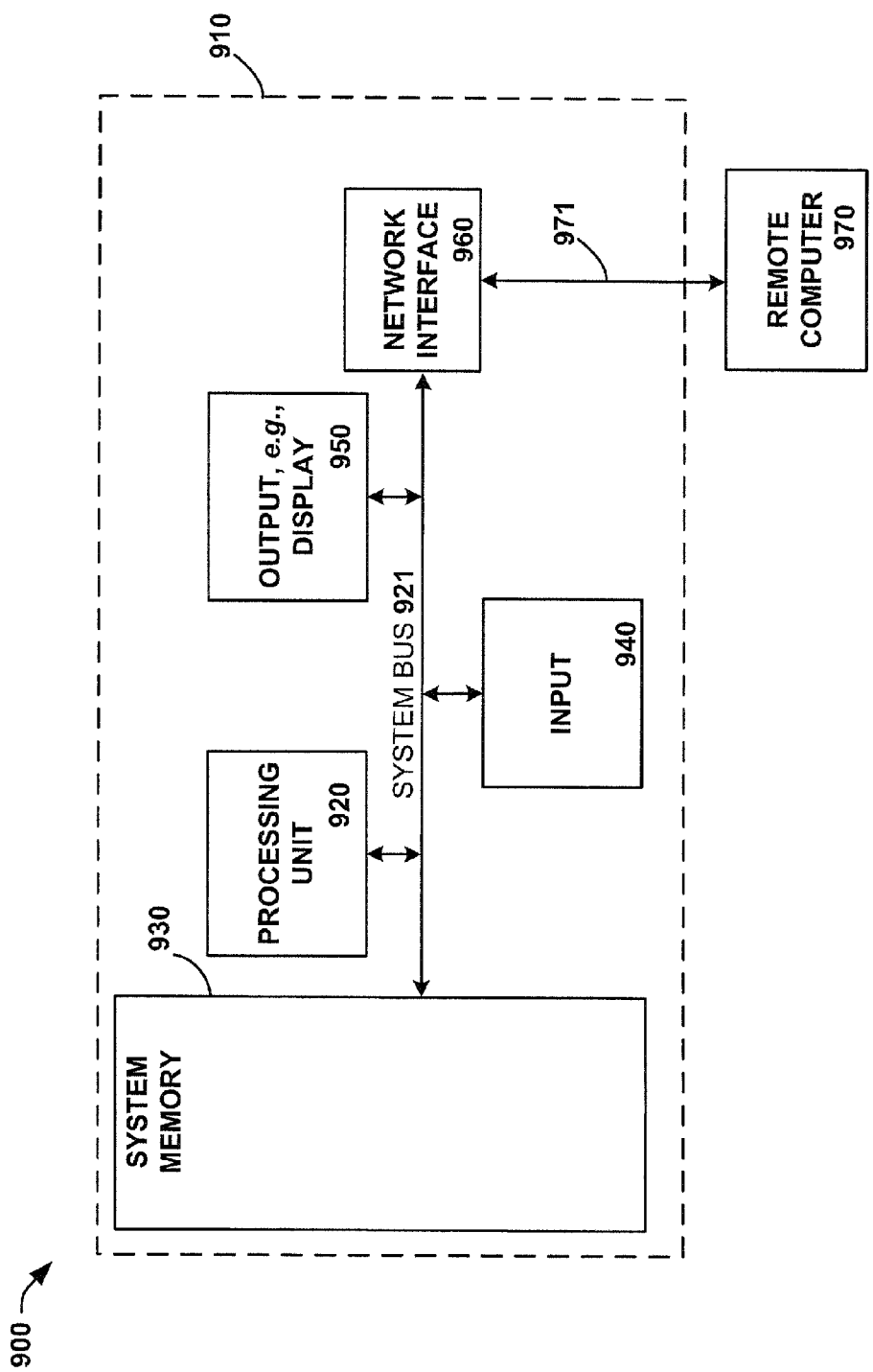
FIG. 9 illustrates a block diagram of an example electronic computing environment that can be implemented in conjunction with one or more aspects described herein.

As mentioned, advantageously, the techniques described herein can be applied to any device and/or network where power management is desirable in a multiprocessor system. It is to be understood, therefore, that handheld, portable and other computing devices and computing objects of all kinds are contemplated for use in connection with the various non-limiting embodiments, i.e., anywhere that a device may wish to implement power management for a multiprocessor system. Accordingly, the below general purpose remote computer described below in FIG. 9 is but one example, and the disclosed subject matter can be implemented with any client having network/bus interoperability and interaction. Thus, the disclosed subject matter can be implemented in an environment of networked hosted services in which very little or minimal client resources are implicated, e.g., a networked environment in which the client device serves merely as an interface to the network/bus, such as an object placed in an appliance.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 9 thus illustrates an example of a suitable computing system environment 1300 in which some aspects of the disclosed subject matter can be implemented, although as made clear above, the computing system environment 1300 is only one example of a suitable computing environment for a device and is not intended to suggest any limitation as to the scope of use or functionality of the disclosed subject matter. Neither should the computing environment 1300 be interpreted as having any dependency or requirement relating to any one or combination of components illustrated in the exemplary operating environment 1300.

With reference to FIG. 9, an exemplary device for implementing the disclosed subject matter includes a general-purpose computing device in the form of a computer 910. Components of computer 910 may include, but are not limited to, a processing unit 920, a system memory 930, and a system bus 921 that couples various system components including the system memory to the processing unit 920. The system bus 921 may be any of several types of bus structures including a memory bus or memory controller, a peripheral bus, and a local bus using any of a variety of bus architectures.

Computer 910 typically includes a variety of computer readable media. Computer readable media can be any available media that can be accessed by computer 910. By way of example, and not limitation, computer readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 910. Communication media typically embodies computer readable instructions, data structures, program modules, or other data in a modulated data signal such as a carrier wave or other transport mechanism and includes any information delivery media.

The system memory 930 may include computer storage media in the form of volatile and/or nonvolatile memory such as read only memory (ROM) and/or random access memory (RAM). A basic input/output system (BIOS), containing the basic routines that help to transfer information between elements within computer 910, such as during start-up, may be stored in memory 930. Memory 930 typically also contains data and/or program modules that are immediately accessible to and/or presently being operated on by processing unit 920. By way of example, and not limitation, memory 930 may also include an operating system, application programs, other program modules, and program data.

The computer 910 may also include other removable/non-removable, volatile/nonvolatile computer storage media. For example, computer 910 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 921 through a non-removable memory interface such as an interface, and a magnetic disk drive or optical disk drive is typically connected to the system bus 921 by a removable memory interface, such as an interface.

A user can enter commands and information into the computer 910 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 920 through user input 940 and associated interface(s) that are coupled to the system bus 921, but may be connected by other interface and bus structures, such as a parallel port, game port, or a universal serial bus (USB). A graphics subsystem can also be connected to the system bus 921. A projection unit in a projection display device, or a HUD in a viewing device or other type of display device can also be connected to the system bus 921 via an interface, such as output interface 950, which may in turn communicate with video memory. In addition to a monitor, computers can also include other peripheral output devices such as speakers which can be connected through output interface 950.

The computer 910 can operate in a networked or distributed environment using logical connections to one or more other remote computer(s), such as remote computer 970, which can in turn have media capabilities different from device 910. The remote computer 970 can be a personal computer, a server, a router, a network PC, a peer device, personal digital assistant (PDA), cell phone, handheld computing device, a projection display device, a viewing device, or other common network node, or any other remote media consumption or transmission device, and may include any or all of the elements described above relative to the computer 910. The logical connections depicted in FIG. 9 include a network 971, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 910 can be connected to the LAN 971 through a network interface or adapter. When used in a WAN networking environment, the computer 910 can typically include a communications component, such as a modem, or other means for establishing communications over the WAN, such as the Internet. A communications component, such as wireless communications component, a modem and so on, which can be internal or external, can be connected to the system bus 921 via the user input interface of input 940, or other appropriate mechanism. In a networked environment, program modules depicted relative to the computer 910, or portions thereof, can be stored in a remote memory storage device. It will be appreciated that the network connections shown and described are exemplary and other means of establishing a communications link between the computers can be used.

Example Networking Environment

Figure 10:
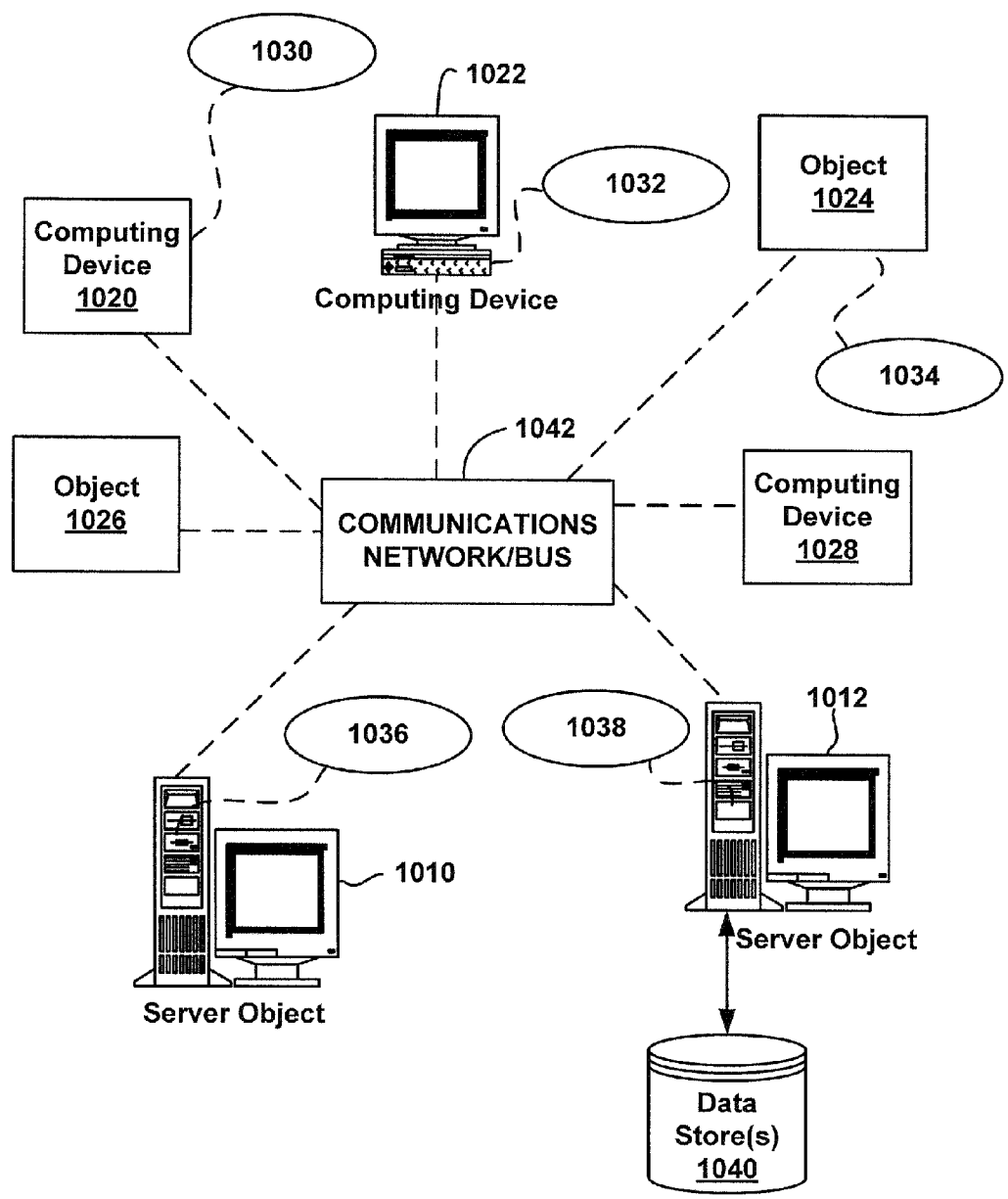
FIG. 10 illustrates a block diagram of an example data communication network that can be operable in conjunction with various aspects described herein.

FIG. 10 provides a schematic diagram of an exemplary networked or distributed computing environment. The distributed computing environment comprises computing objects 1010, 1012, etc. and computing objects or devices 1020, 1022, 1024, 1026, 1028, etc., which may include programs, methods, data stores, programmable logic, etc., as represented by applications 1030, 1032, 1034, 1036, 1038 and data store(s) 1040. It can be appreciated that computing objects 1010, 1012, etc. and computing objects or devices 1020, 1022, 1024, 1026, 1028, etc. may comprise different devices, including a multimedia display device or similar devices depicted within the illustrations, or other devices such as a mobile phone, personal digital assistant (PDA), audio/video device, MP3 players, personal computer, laptop, etc. It should be further appreciated that data store(s) 1040 can include one or more cache memories, one or more registers, or other similar data stores disclosed herein.

Each computing object 1010, 1012, etc. and computing objects or devices 1020, 1022, 1024, 1026, 1028, etc. can communicate with one or more other computing objects 1010, 1012, etc. and computing objects or devices 1020, 1022, 1024, 1026, 1028, etc. by way of the communications network 1042, either directly or indirectly. Even though illustrated as a single element in FIG. 10, communications network 1042 may comprise other computing objects and computing devices that provide services to the system of FIG. 10, and/or may represent multiple interconnected networks, which are not shown. Each computing object 1010, 1012, etc. or computing object or devices 1020, 1022, 1024, 1026, 1028, etc. can also contain an application, such as applications 1030, 1032, 1034, 1036, 1038, that might make use of an API, or other object, software, firmware and/or hardware, suitable for communication with or implementation of the techniques and disclosure described herein.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems automatic diagnostic data collection as described in various embodiments herein.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service, in some cases without having to "know" any working details about the other program or the service itself.

In a client/server architecture, particularly a networked system, a client is usually a computer that accesses shared network resources provided by another computer, e.g., a server. In the illustration of FIG. 10, as a non-limiting example, computing objects or devices 1020, 1022, 1024, 1026, 1028, etc. can be thought of as clients and computing objects 1010, 1012, etc. can be thought of as servers where computing objects 1010, 1012, etc., acting as servers provide data services, such as receiving data from client computing objects or devices 1020, 1022, 1024, 1026, 1028, etc., storing of data, processing of data, transmitting data to client computing objects or devices 1020, 1022, 1024, 1026, 1028, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 1042 or bus is the Internet, for example, the computing objects 1010, 1012, etc. can be Web servers with which other computing objects or devices 1020, 1022, 1024, 1026, 1028, etc. communicate via any of a number of known protocols, such as the hypertext transfer protocol (HTTP). Computing objects 1010, 1012, etc. acting as servers may also serve as clients, e.g., computing objects or devices 1020, 1022, 1024, 1026, 1028, etc., as may be characteristic of a distributed computing environment.

Reference throughout this specification to "one embodiment," "an embodiment," "an example", "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one example," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

Unless otherwise indicated, all numbers, values and/or expressions referring to characteristics (e.g. speed) used in the specification and claims are to be understood as modified in all instances by the term "about."

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A system, comprising:
a set of full duplex twinax pairs that has a set of twin axial cables, comprising no more than four twin axial cables, configured for communicating a set of signals in opposite directions concurrently at a speed that is greater than two hundred gigabytes per second in each direction, the set of twin axial cables being configured to have no more than eight conductors;
a plug assembly configured for integrating at least one end of the set of full duplex twinax pairs with a set of interconnects, and connecting the at least one end with an interface port, the plug assembly comprising:
a transceiver component configured for communicating the set of signals in the opposite directions to and from the interface port via the set of full duplex twinax pairs; and
a processor operatively coupled to the transceiver component that is configured for digital signal processing of the set of signals via the set of full duplex twinax pairs, the processor being integrated with a head of a twin axial cable of the set of twin axial cables and connected to the interface port to facilitate connecting the twin axial cable to the interface port that is associated with a circuit board of the system.

2. The system of claim 1, wherein the processor is further configured for facilitating a communication of the set of signals via the at least one end of the set of full duplex twinax pairs via a surface mount assembly operatively coupled to the transceiver component.

3. The system of claim 1, wherein the set of full duplex twinax pairs comprises a twinaxial pair of two conductors that is configured for a communication of the set of signals in the opposite directions simultaneously, wherein a pair of conductors of the no more than eight conductors is the twinaxial pair of two conductors.

4. The system of claim 1, wherein the set of full duplex twinax pairs is configured for communicating the set of signals in the opposite directions at the speed that is greater than two hundred gigabytes per second in each direction by encoding at least a portion of the set of signals in a communication protocol to transmit the set of signals from a first device and to a second device.

5. The system of claim 1, wherein the plug assembly is operatively connected to the set of full duplex twinax pairs via the set of interconnects, and further configured for consuming power from the at least one end of the set of full duplex twinax pairs.

6. The system of claim 1, wherein the plug assembly further comprises an interface that comprises at least one of a quad small form factor pluggable interface or a small form factor pluggable interface.

7. The system of claim 6, wherein the interface comprises a set of copper interconnects that operatively couple the set of full duplex twinax pairs to the interface port.

8. The system of claim 1, wherein the no more than four twin axial cables are configured for communicating the set of signals in the opposite directions concurrently at the speed of at least eight hundred gigabytes per second.

9. A method comprising:
integrating a reduced set of twinax pairs that has not more than four full duplex twin axial cables with a processor and a transceiver of a plug assembly, wherein the not more than four full duplex twin axial cables being configured to have not more than eight twinax conductors, and the integrating comprising integrating the processor on a head of a full duplex twin axial cable of the not more than four full duplex twin axial cables, the processor being connected to an interface to facilitate connecting the full duplex twin axial cable to the interface, the interface being associated with a circuit board;
receiving one or more signals via the plug assembly;
encoding at least a part of the one or more signals with a first communication protocol by the processor; and
transmitting by the transceiver the one or more signals via the reduced set of twinax pairs from the processor at a speed that exceeds two hundred gigabytes per second,
wherein the receiving the one or more signals and the transmitting the one or more signals comprise communicating the one or more signals in a full-duplex communication simultaneously in different directions between a first device and a second device at the speed that exceeds two hundred gigabytes per second in each direction.

10. The method of claim 9, wherein the transmitting the one or more signals via the reduced set of twinax pairs comprises communicating the one or more signals at the speed of at least three hundred gigabytes per second.

11. The method of claim 9, wherein the integrating the reduced set of twinax pairs with the processor and the transceiver of the plug assembly comprises integrating the not more than four twin axial cables, comprising a pair of twinax conductors, with a microprocessor package assembly having a mounting assembly coupled to the circuit board.

12. The method of claim 9, wherein the receiving the one or more signals and the transmitting the one or more signals comprise communicating the one or more signals in a full-duplex communication simultaneously in the different directions between the first device and the second device.

13. The method of claim 9, further comprising:
encoding at least a portion of the one or more signals in a second communication protocol to transmit the one or more signals from the first device and to the second device.

14. The method of claim 13, further comprising:
selecting from the first communication protocol and the second communication protocol which protocol to encode the at least the part of the one or more signals.

15. The method of claim 14, wherein the selecting is based on at least one of a specification of the one or more signals, a communication protocol of the one or more signals, a device communication protocol of the first device or the second device coupled to one or more ends of the reduced set of twinax pairs, or a selection of a twinax pair of the reduced set of twinax pairs.

16. The method of claim 9, further comprising:
drawing power via at least one end of the reduced set of twinax pairs from at least one of an independent power source, wherein the one or more signals received from the first device or the second device, or from a power source of the first device or the second device.

17. A device comprising:
a memory to store computer-executable instructions; and
a first processor, coupled to the memory, that facilitates execution of the computer-executable instructions to perform operations, comprising:
- transmitting a first set of signals via a twin axial copper cable assembly that has not greater than four twinax copper pairs to a second device in a first communication protocol at a transmission speed that is greater than two hundred gigabytes per second, a second processor being integrated with a head of a twinax copper pair of the not greater than four twinax copper pairs and connected to an interface port to facilitate connecting the twinax copper pair to the interface port that is associated with a circuit board of the device; and
- receiving simultaneously in a full-duplex transmission mode a second set of signals from the second device via the not greater than four copper twinax pairs of the twin axial copper cable assembly at a speed of that is greater than two hundred gigabytes per second, wherein the not greater than four twinax copper pairs have not greater than eight conductors.

18. The device of claim 17, wherein the transmitting comprises encoding, via the second processor, at least a part of the first set of signals in the first communication protocol with the transmission speed that is greater than two hundred gigabytes per second.

19. The device of claim 18, wherein the second processor is integrated within a plug assembly configured for integrating the not greater than four twinax copper pairs on a package mount assembly comprising copper interconnects to the second processor and draws power from at least one of an independent power source within the plug assembly and connected to the package mount assembly, the first set of signals or the second set of signals, or a power source external to the twin axial copper cable assembly that comprises the plug assembly.

20. The device of claim 17, wherein the not greater than four twinax copper pairs each comprise two conductors and a plug assembly that comprises an interface comprising at least one of a quad small form factor pluggable interface or a small form factor pluggable interface.

* * * * *